(12) United States Patent
Weber

(10) Patent No.: US 6,274,395 B1
(45) Date of Patent: Aug. 14, 2001

(54) METHOD AND APPARATUS FOR MAINTAINING TEST DATA DURING FABRICATION OF A SEMICONDUCTOR WAFER

(75) Inventor: David M. Weber, Monument, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/471,842

(22) Filed: Dec. 23, 1999

(51) Int. Cl.$^7$ ...................................... G01R 31/26
(52) U.S. Cl. ............................................................ 438/14
(58) Field of Search ............................... 438/14, 15, 259, 438/261; 364/579; 365/103; 257/411

(56) References Cited

U.S. PATENT DOCUMENTS

| | | |
|---|---|---|
| Re. 33,947 | 6/1992 | Shinohara . |
| 3,814,895 | 6/1974 | Fredriksen . |
| 4,543,464 | 9/1985 | Takeuchi . |
| 4,747,093 | 5/1988 | Benne et al. . |
| 4,933,205 | 6/1990 | Duley et al. . |
| 5,206,181 | 4/1993 | Gross . |
| 5,256,578 | 10/1993 | Corley et al. . |
| 5,543,365 | 8/1996 | Wills et al. . |
| 5,726,920 | * 3/1998 | Chen ..................................... 364/579 |
| 5,801,076 | * 9/1998 | Fulford ................................ 438/261 |
| 5,805,013 | * 9/1998 | Ghneim ................................ 257/411 |
| 6,140,182 | * 10/2000 | Chen ..................................... 438/259 |
| 6,185,122 | * 2/2001 | Johnson ............................... 365/103 |

* cited by examiner

*Primary Examiner*—John F. Niebling
*Assistant Examiner*—André C. Stevenson

(57) ABSTRACT

A method of fabricating a semiconductor wafer includes the step of fabricating a number of die on the wafer. The method also includes the step of fabricating a memory device on the wafer. The method further includes the step of testing the number of die with a die testing apparatus so as to obtain test data associated with the number of die. In addition, the method includes the step of storing the test data obtained during the testing step in the memory device. Moreover, the method includes the step of retrieving the test data from the memory device. Yet further, the method includes the step of operating a packaging apparatus so as to package a first die of the number of die based on the test data. A semiconductor wafer is also disclosed.

17 Claims, 3 Drawing Sheets

METHOD AND APPARATUS FOR MAINTAINING TEST DATA DURING FABRICATION OF A SEMICONDUCTOR WAFER

TECHNICAL FIELD OF THE INVENTION

The present invention relates generally to semiconductor wafer fabrication, and more particularly to a method and apparatus for maintaining test data during fabrication of a semiconductor wafer.

BACKGROUND OF THE INVENTION

The manufacture of semiconductor wafers to create semiconductor integrated circuit devices typically involves the fabrication of a plurality of die on a single wafer. Each of the die are fabricated from a sequence of processing steps which create the multi-layer structure generally associated with integrated circuit devices. Such processing steps may include (1) the deposition of metals, dielectrics, and semiconductor films, (2) the creation of masks by lithography techniques, (3) the doping of semiconductor layers by diffusion or implantation, (4) the polishing of outer layers (e.g. chemical-mechanical polishing), and (5) the etching of layers for selective or blanket material removal.

During manufacture of integrated circuit devices, each individual die is tested prior to separation from the wafer. Such testing may include visual and electrical tests designed to distinguish "good" die from unusable or "bad" die. Such testing may also be designed to determine certain parametric characteristics about each die such as the voltage range, temperature range, or speed range at which the die operates.

Once tested, each individual die must be marked or somehow identified so that the die can be properly handled during the die separation and packaging processes. In particular, if a die fails one or more tests, it must be marked or otherwise identified such that the die may be disregarded. Conversely, if a die passes all tests, it must be marked or otherwise identified in order for the die to be presented to subsequent processing steps (e.g. packaging). It should be appreciated that a high degree of accuracy in the marking or identifying scheme is desirable. For example, if a die which failed one or more test is inadvertently packaged, the defective device may ultimately be sold thereby causing the system into which it is incorporated to potentially fail.

Accordingly, a number of wafer marking methods have heretofore been designed. One common marking method is wafer scribing. Wafer scribing utilizes a laser or the like to mechanically scribe information into a surface of the wafer. However, mechanical scribing is slow, costly, and the amount of information which may be written at a single location is relatively limited. Moreover, laser scribing is a "write once" method of recording information. In particular, once information has been scribed into a certain portion of the wafer, the same portion generally can not be utilized again to scribe additional information into the wafer. Because of these limitations, wafer scribing has generally only been utilized to record static information such as a wafer identification code, lot/date code, or part number.

Another wafer marking method is inking. Wafer inking is a process by which an ink mark such as a dot is placed on each die to indicate the pass/fail status of each die. However, similarly to wafer scribing, wafer inking is a write once method since the ink utilized in such a method is designed to be relatively difficult to remove from the die so as to prevent inadvertent removal thereof. Moreover, the number of categories into which a die may be divided is limited by the number of different ink colors which can be identified by a color detection device such as a calorimeter. In particular, if the particular type of testing performed sorts the die into different groups based on, for example, operative speed of the die, a different color of ink must be utilized for each group. If the number of desirable groups exceeds the number of different ink colors available, alternate marking schemes must be utilized thereby reducing the efficiency of the fabrication process.

A more recent approach to wafer tracking is the use of electronic files stored on a floppy disk or a network storage device. In such a method, a file containing test data such as pass/fail data associated with each of the die fabricated on a given wafer is stored on the floppy disk or network storage device. During packaging, the information is retrieved from the floppy disk or network storage device so as to determine which die passed testing and which die failed. However, it should be appreciated that this approach is susceptible to mistakes if the correlation between a particular wafer and its electronic file becomes mixed with that of another wafer.

Thus, a continuing need exists for a wafer marking and/or identifying method which overcomes one or more of the above mentioned drawbacks.

SUMMARY OF THE INVENTION

In accordance with one embodiment of the present invention, there is provided a method of fabricating a semiconductor wafer. The method includes the step of fabricating a number of die on the wafer. The method also includes the step of fabricating a memory device on the wafer. The method further includes the step of testing the number of die with a die testing apparatus so as to obtain test data associated with the number of die. Moreover, the method includes the step of storing the test data obtained during the testing step in the memory device.

Pursuant to another embodiment of the present invention, there is provided a method of fabricating a semiconductor wafer. The method includes the step of fabricating a number of die on the wafer. The method also includes the step of fabricating a memory device on the wafer. The method further includes the step of testing the number of die with a die testing apparatus so as to obtain test data associated with the number of die. In addition, the method includes the step of storing the test data obtained during the testing step in the memory device. Moreover, the method includes the step of retrieving the test data from the memory device. Yet further, the method includes the step of operating a packaging apparatus so as to package a first die of the number of die based on the test data.

Pursuant to yet another embodiment of the present invention, there is provided a semiconductor wafer. The semiconductor wafer includes a number of die fabricated on a first side of the wafer. The semiconductor wafer also includes a memory device fabricated on the first side of the wafer. The memory device has stored therein test data associated with each of the number of die.

Pursuant to another embodiment of the present invention, there is provided a semiconductor wafer. The semiconductor wafer includes a number of die fabricated on a first side of the wafer. The semiconductor wafer also includes a memory device fabricated on the first side of the wafer. The memory device is configured to store test data associated with each of the number of die.

It is therefore an object of the present invention to provide a new and useful semiconductor wafer.

It is also an object of the present invention to provide an improved semiconductor wafer.

It is further an object of the present invention to provide a new and useful method of fabricating a semiconductor wafer.

It is moreover an object of the present invention to provide an improved method of fabricating a semiconductor wafer.

It is a further object of the present invention to provide a method of maintaining test data associated with a semiconductor wafer during fabrication thereof which does not require inking or scribing of the wafer.

It is also an object of the present invention to provide a method of maintaining test data associated with a semiconductor wafer during fabrication thereof which does not reduce the size of the active area of the wafer.

The above and other objects, features, and advantages of the present invention will become apparent from the following description and the attached drawings.

DETAILED DESCRIPTION OF A PREFERRED EMBODIMENT

Figure 1:
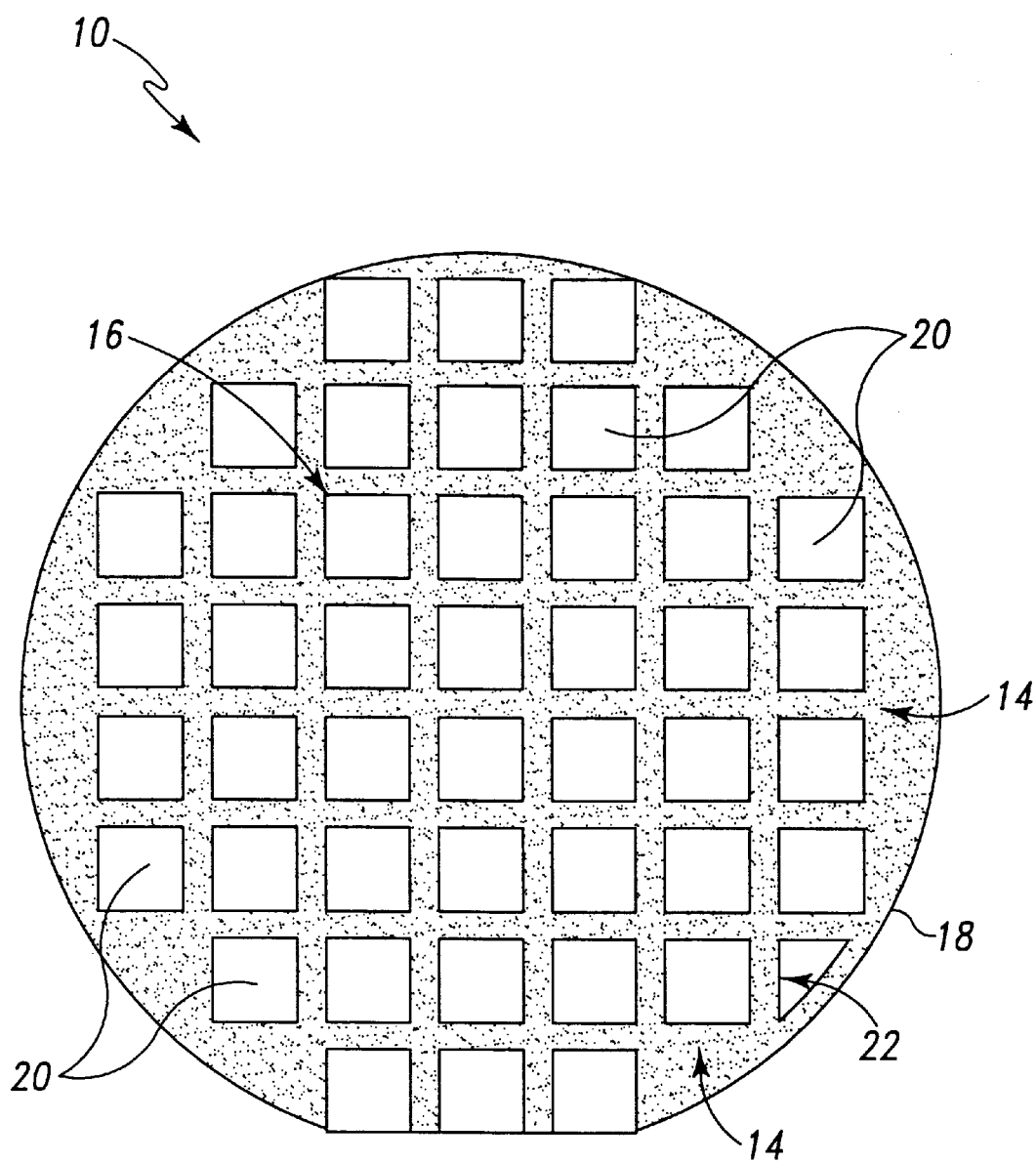
FIG. 1 is a plan view of a semiconductor wafer which incorporates the features of the present invention therein.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Referring now to FIG. 1, there is shown a semiconductor wafer 10 which has an inactive area 14 and an active area 16. The inactive area 14 is a "clear out" area which is utilized as a resist edge bead removal region. In particular, during fabrication of the semiconductor wafer 10, photoresist is not patterned within the inactive area 14 of the semiconductor wafer 10 in order to prevent "wrap around" of the resist. Wrap around is a condition which occurs when photoresist is coated too closely to the outer edge of a wafer (i.e. the outer edge 18) which allows the resist to "wrap around" to the back side of the wafer. Moreover, the inactive area 14 is utilized as a tool clamp region in which a wafer handling tool such as a clamping tool device associated with an etcher engages the semiconductor wafer 10. Hence, what is meant herein by the term "inactive area" is a relatively narrow area along the outer periphery of the semiconductor wafer 10 that a wafer designer intentionally leaves devoid of active die during wafer layout design in order to provide for either a resist edge bead removal region and/or a tool clamp region.

The active area 16 of the semiconductor wafer 10 includes a number of active die 20. In particular, the fabrication process deposits or otherwise fabricates various patterned layers within the active area 16 so as to fabricate or otherwise construct the active die 20. It should be appreciated that each of the active die 20 will be singulated and packaged so as to form an integrated circuit device at the completion of the fabrication process. Hence, what is meant herein by the term "active area" is the inner area of the semiconductor wafer 10 (i.e. the area inside of the inactive area 14) in which the active die 20 are fabricated.

As shown in FIG. 1, a memory device 22 is fabricated in the inactive area 14 of the semiconductor wafer 10. Although only a single memory device 22 is shown in FIG. 1, it should be appreciated that any number of memory devices 22 may be fabricated on the semiconductor wafer 10. It should be appreciated that the memory device 22 is fabricated in a location within the inactive area 14 which is not contacted by a clamping tool or other fabrication device. By fabricating the memory device 22 in the inactive area 14, usable surface area within the active area 16 is increased thereby increasing the number of active die 20 which may be fabricated on a single wafer 10 thereby increasing efficiency of the fabrication process.

The memory device 22 is fabricated contemporaneously with each of the active die 20. In particular, during the fabrication process which fabricates the active die 20, the memory device 22 is likewise fabricated. Hence, the same fabrication steps which create the active die 20 (e.g. photolithography steps, deposition steps, etcetera) are also utilized to create the memory device 22.

The memory device 22 may be embodied as any type of memory device which is capable of storing data such as individual die pass/fail and parametric data. Preferably, the memory device 22 is embodied as a non-volatile memory device. One such non-volatile memory device which is particularly useful as the memory device 22 of the present invention is a flash memory device such as a EEPROM memory device. Hence, in such a configuration, the EEPROM memory device 22 is fabricated in the inactive area 14 of the semiconductor wafer 10. Such EEPROM memory devices are commonly fabricated on the active die of certain integrated circuit devices thereby rendering a detailed discussion of the fabrication of such memory devices unnecessary. Moreover, in order to reduce the number of occasions in which the EEPROM memory device 22 itself is fabricated with a defect, the memory device 22 is preferably constructed with defect-tolerant devices such as non-minimally sized transistors, lines, and spaces.

Figure 2:
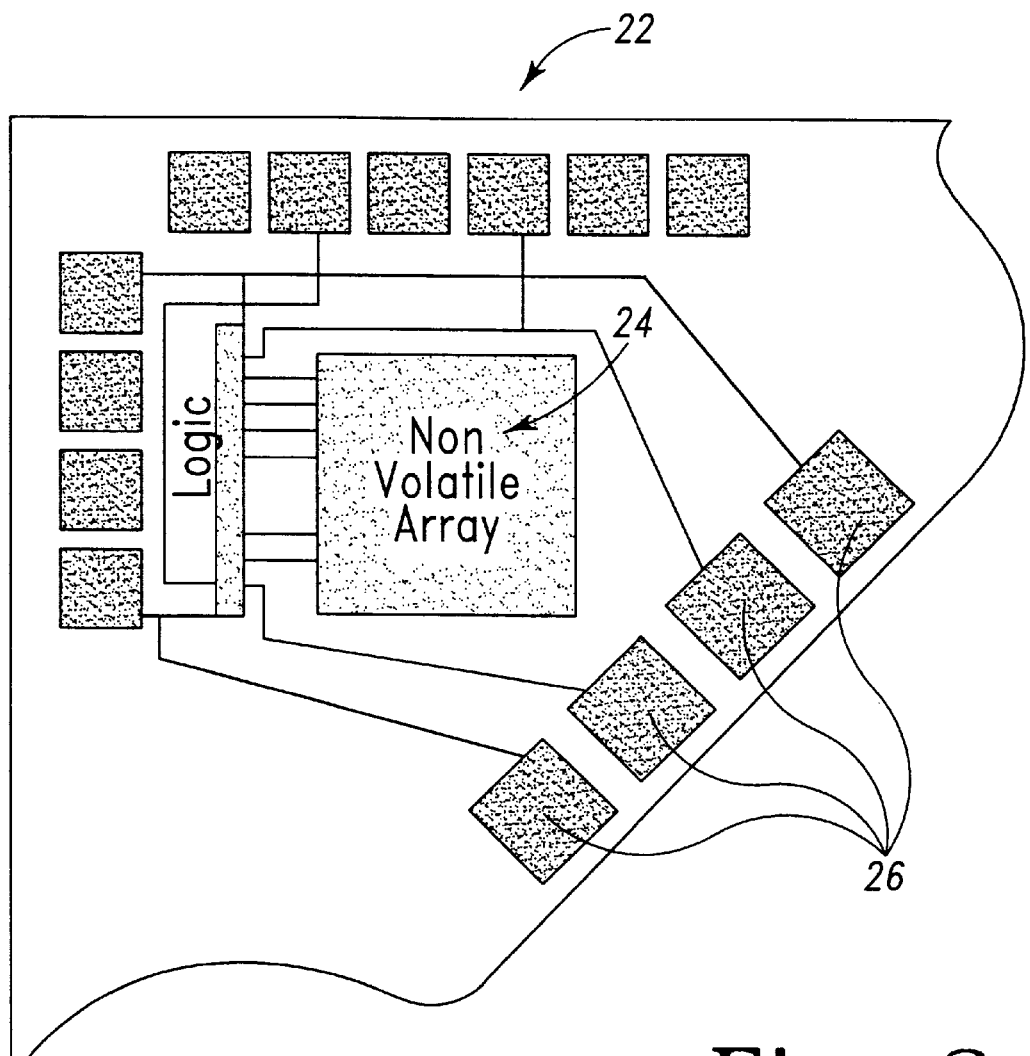
FIG. 2 an enlarged fragmentary view of a portion of FIG. 1 which shows the memory device which is fabricated on the wafer.

As shown in FIG. 2, the memory device 22 includes a non-volatile array 24 and a number of contact pads 26. Information such as test data associated with each of the active die 20 fabricated on the semiconductor wafer 10 may be stored in the non-volatile array 24. The contact pads 26 are provided to provide an electrical path to couple the non-volatile array 24 to a probe or the like (not shown) associated with a programming device or the like. In particular, as shall be discussed below in greater detail, subsequent to testing of each of the active die 20, a record associated with each active die 20 is stored in the non-volatile memory array 24 by use of an electrical probe which contacts the contact pads 26. Likewise, an electrical probe associated which a die packaging machine contacts the contact pads 26 in order read or otherwise retrieve the test data stored in the non-volatile array 24 in order to determine which active die 20 are to be packaged (e.g. which active die 20 passed functional test) and which active die 20 are to be disregarded or otherwise scrapped (e.g. which active die 20 failed functional test). Data transfer protocols and storage methods for transferring and storing data in a memory array of a non-volatile memory device such as a EEPROM device are commonly known and further discussion thereof is not warranted.

As alluded to above, data associated with each of the active die 20 fabricated on the semiconductor wafer 10 may be stored in the memory device 22. For example, subsequent to a test procedure such as final wafer functional test, a record corresponding to each active die 20 on the semiconductor wafer 10 may be stored in a separate memory location of the memory device 22. The record may include a "pass" record if the particular active die 20 passes final wafer functional test, or may alternatively, include a "fail" record if the particular active die 20 fails final wafer functional test.

Other types of data associated with each of the active die 20 fabricated on the semiconductor wafer 10 may also be stored in the memory device 22. For example, parametric data associated with each of the active die 20 fabricated on the semiconductor wafer 10 may also be stored in the memory device 22. What is meant herein by the term "parametric data" is data indicative of a performance characteristic of a given active die. For instance, parametric data stored in the memory device 22 may include the speed at which a particular active die 20 operates. Parametric data stored in the memory device 22 may also include an output characteristic such as a measured voltage on a particular output node associated with a given active die 20. As a further example, parametric data stored in the memory device 22 may also include the temperature range at which a particular active die 20 operates.

It should be appreciated that such parametric data may be utilized to sort the active die 20 of the semiconductor wafer 10 into distinct groups. For example, it is common for identically-fabricated integrated circuit devices to be sorted into groups based on the speed of the individual devices. For example, a first integrated circuit device which operates at a faster speed relative to a second, identical device may be sold at a higher price relative to the second device. Use of the memory device 22 to store parametric data associated with the speed of each of the active die 20 on a given semiconductor wafer 10 facilitates such sorting.

Moreover, sorting may also be utilized to identify those active die 20 which vary within predetermined ranges of a desired output characteristic. For example, integrated circuit devices having an output voltage on a particular pin which is within 5% of a target voltage may be grouped into a first group, whereas devices having an output voltage which is between 6–10% of the target voltage may be placed into a second group. Similarly to the example described above, use of the memory device 22 facilitates such sorting of the active die 20.

In addition, the memory device 22 may also be utilized to store other types of test or identifying data associated with a given active die 20. For example, it is common in the semiconductor industry to build devices which are otherwise identical except that one device includes integrated memory structure, whereas as a second device does not. Such devices may be fabricated from the same die design in order to reduce development costs. In such a situation, the concepts of the present invention may be utilized to reduce the number of active die 20 which are disregarded at the end of the fabrication process thereby increasing yields. In particular, if a given active die 20 fails functional wafer tests related to its integrated memory structure, but otherwise passes all other wafer tests, the memory device 22 may be utilized to record such test data such that at packaging, the active die 20 is not disregarded, but rather is utilized in the fabrication of the device type which does not include the integrated memory structure. In such a manner, active die 20 which would otherwise be disregarded may be used as salable product.

Figure 3:
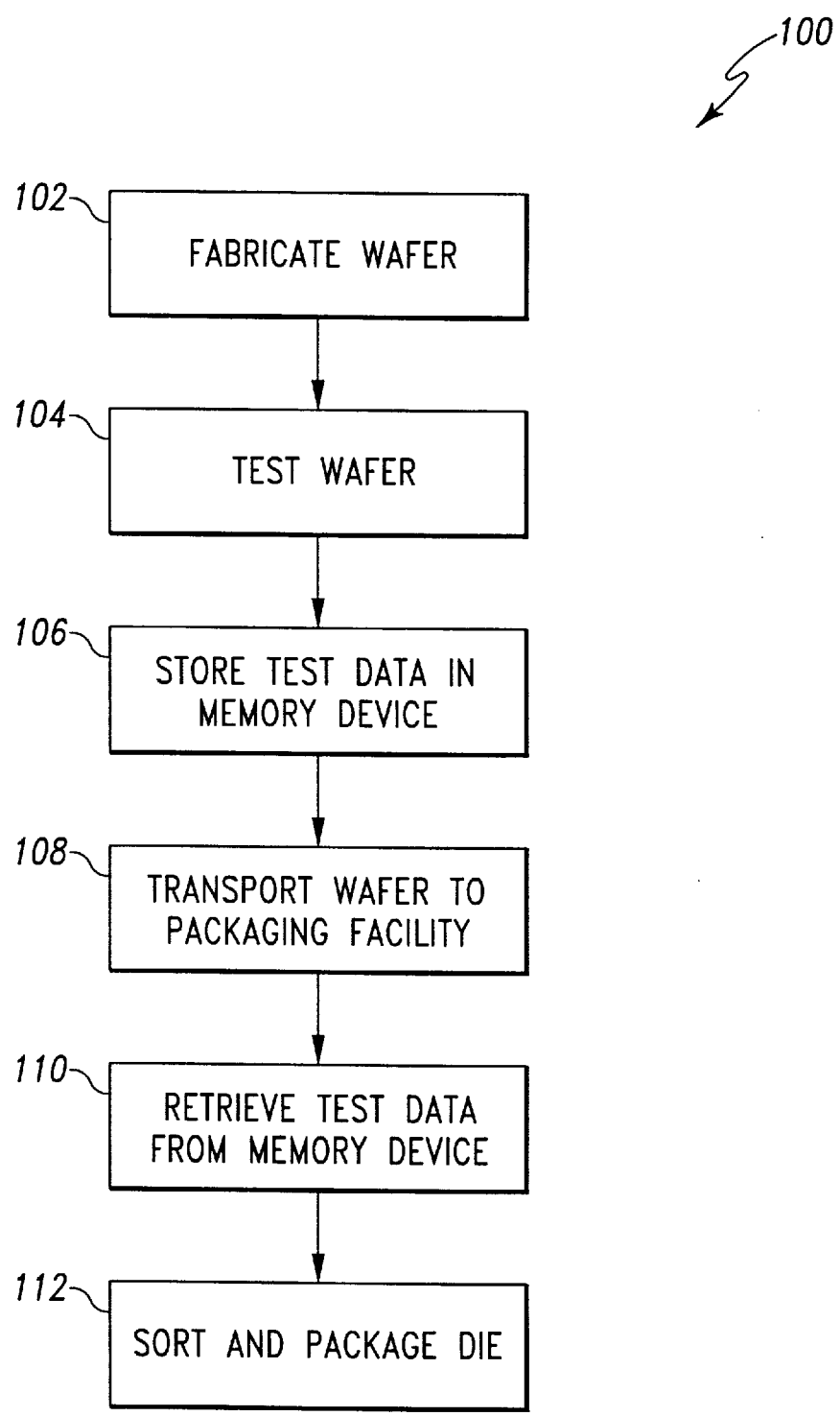
FIG. 3 is a flow chart which sets forth a method for fabricating the semiconductor wafer of FIG. 1.

In operation, during fabrication of the semiconductor wafer 10 and subsequent packaging thereof, the memory device 22 may be utilized to store information such as test data associated with each of the active die 20 fabricated on the semiconductor wafer 10. In particular, as shown in FIG. 3, there is shown a flowchart which describes a device fabrication process 100 for fabricating integrated circuit devices according to the present invention. The fabrication process 100 begins with step 102 in which each of the active die 20 and the memory device 22 are fabricated in a wafer fabrication process. In particular, a plurality of active die 20 and one or more of the memory devices 22 are fabricated on a single semiconductor wafer 10. Each of the active die 20 and the memory devices 22 are contemporaneously fabricated from a sequence of processing steps which create the multi-layer structure generally associated with integrated circuit devices. Such processing steps may include (1) the deposition of metals, dielectrics, and semiconductor films, (2) the creation of masks by lithography techniques, (3) the doping of semiconductor layers by diffusion or implantation, (4) the polishing of outer layers (e.g. chemical-mechanical polishing), and (5) the etching of layers for selective or blanket material removal.

Subsequent to wafer fabrication of the active die 20 and the memory device(s) 22, the semiconductor wafer 10 is electrically tested in step 104. In particular, the wafer 10 is loaded into a test apparatus which functionally tests each of the active die 20 fabricated on the wafer 10. As described above, the functional test may include testing the active die 20 against predetermined test values in order to produce a "pass" or "fail" status for each active die 20, or may alternatively include the procurement of parametric data such as the operational speed of each active die 20.

It should be appreciated that a test may initially be performed on the memory device 22 itself. In particular, in order to prevent storage of test data into a defective memory device 22, the memory device 22 may be tested as part of the wafer functional test. It should be appreciated that an alternative memory device 22 may be utilized if a first memory device 22 is determined to be defective (assuming that the wafer 10 is designed with multiple memory devices 22). If a backup memory device 22 is not available, manual systems of wafer marking may be reverted to in order to track the wafer 10 through packaging.

The results of the functional wafer testing are stored in the memory device 22 in step 106. In particular, either during or after the testing procedure of step 104, test data associated with each of the active die 20 fabricated on the semiconductor wafer 10 is stored in a corresponding memory location of the memory device 22. For example, if during testing of a particular active die 20, the active die 20 fails the functional test, a die-fail control signal is generated by the test apparatus which causes a fail record to be stored in the memory device 22 at a memory location corresponding to the failed active die 20. As described above, such data is communicated to the memory device 22 from the test apparatus via a test probe (not shown) which contacts the contact pads 26 (see FIG. 2) so as to facilitate communication with the memory array 24 of the memory device 22. Conversely, if a particular active die 20 passes the functional test, a die-pass control signal is generated by the test apparatus which causes a pass record to be stored in the memory device 22 at a memory location corresponding to the passed active die 20. Moreover, as described above, other data, such as parametric data (e.g. operational speed of the active die 20) may also be stored in the memory device 22 in step 106.

Once data associated with each active die 20 of the semiconductor wafer 10 has been stored in the memory device 22, the wafer 10 is transported for subsequent processing thereof. In particular, in step 108, the wafer 10 may be transported to a packaging facility which singulates or otherwise separates the individual active die 20 from the wafer 10 and thereafter packages the active die 20 so as to create a finished integrated circuit device which may be utilized in the construction of an electronic system. It should be appreciated that the packaging facility may be in the same general location (e.g. the same building or plant) as the test facility, or may alternatively be at a remote location (e.g. a different building) from the test facility.

In any event, as shown in steps 110 and 112 once the semiconductor wafer 10 is transported to the packaging facility, data stored in the memory device 22 is utilized to determine which of the active die 20 are to be packaged and thereafter shipped as salable goods, and which of the active die 20 are to be disregarded. In particular, an electronic probe (not shown) associated with a packaging apparatus reads or otherwise retrieves data associated with each of the active die 20 from the memory device 22. In the case of when only "pass/fail" data associated with each of the active die 20 is stored in the memory device 22, the packaging apparatus reads each memory location of the memory device 22 in order to determine which active die 20 have a pass record associated therewith and which active die 20 have a fail record associated therewith. Thereafter, the packaging apparatus packages those active die 20 which have a pass record associated therewith and disregards those active die 20 which have a fail record associated therewith.

It should be appreciated that in the case of when other data types are stored in the memory device 22, the packaging apparatus may perform additional functions. For example, in the case of when parametric data associated with the operational speed of each active die 20 is stored in the memory device 22, the packaging apparatus may sort the active die 20 into a predetermined number of groups based on the stored speed value of each active die 20.

Hence, as described herein, use of the memory device 22 provides numerous advantages over heretofore designed marking/identifying schemes. In particular, use of the memory device 22 provides a die status identifying scheme which may be altered if the status of a given active die 20 changes. For example, assume that a semiconductor wafer 10 is initially tested and the results of such testing indicate that 50% of the active die 20 on the wafer 10 have failed the test. However, it is subsequently discovered that the testing apparatus erroneously failed a large number of active die 20 (i.e. false fails), the record associated with each of the active die 20 may be updated in the memory device 22 subsequent to retesting of the wafer 10. It should be appreciated that such updating of the status of each of the active die 20 is generally not possible when scribing or inking is utilized to mark the active die 20.

Moreover, use of the memory device 22 provides a die status identifying scheme which is "affixed" or otherwise stays with the wafer 10 thereby preventing inadvertent use of data associated with a different wafer. For example, unlike the heretofore used method of storing test data on a floppy disk or in an electronic network file, the information (e.g. test data) associated with a given wafer 10 is stored on the wafer itself thereby preventing the data from being inadvertently swapped with data from another wafer.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected.

There are a plurality of advantages of the present invention arising from the various features of the wafer fabrication process described herein. It will be noted that alternative embodiments of the wafer fabrication process of the present invention may not include all of the features described yet still benefit from at least some of the advantages of such features. Those of ordinary skill in the art may readily devise their own implementations of the wafer fabrication process that incorporate one or more of the features of the present invention and fall within the spirit and scope of the present invention as defined by the appended claims.

For example, it should be appreciated that the memory device 22 of the present invention may be embodied as a discrete memory device (as shown) or may alternatively be embodied in other manners. For instance, memory structures associated with the active die 20 themselves may be utilized to store the test information associated with the active die 20.

What is claimed is:

1. A method of fabricating a semiconductor wafer, comprising the steps of:
    fabricating a number of die on said wafer;
    fabricating a memory device on said wafer;
    testing said number of die with a die testing apparatus so as to obtain test data associated with said number of die; and
    storing said test data obtained during said testing step in said memory device.

2. The method of claim 1, wherein:
    said testing step includes the steps of (i) performing a functional test on a first die of said number of die with said die testing apparatus, and (ii) generating a die-pass control signal if said first die of said number of die passes said functional test, and
    said storing step includes the step of storing a pass record in a data location associated with said first die of said number of die in said memory device in response to generation of said die-pass control signal.

3. The method of claim 1, wherein:
    said testing step includes the steps of (i) performing a functional test on a first die of said number of die with said die testing apparatus, and (ii) generating a die-fail control signal if said first die of said number of die fails said functional test, and
    said storing step includes the step of storing a fail record in a data location associated with said first die of said number of die in said memory device in response to generation of said die-fail control signal.

4. The method of claim 1, wherein:
    said testing step includes the step of obtaining parametric data associated with a performance characteristic of a first die of said number of die, and
    said storing step includes the step of storing a record which includes said parametric data in a data location associated with said first die of said number of die in said memory device.

5. The method of claim 1, further comprising the steps of:
    retrieving said test data from said memory device; and
    operating a packaging apparatus so as to package a first group of said number of die based on said test data.

6. The method of claim 5, further comprising the step:
    operating said packaging apparatus so as to disregard a second group of said number of die based on said test data.

7. The method of claim 1, wherein:

said memory device includes a non-volatile memory device, and said storing step includes the step of storing said test data obtained during said testing step in said non-volatile memory device.

8. The method of claim 7, wherein said memory device fabricating step includes the step of fabricating said non-volatile memory device on said wafer.

9. The method of claim 8, wherein said non-volatile memory device includes a flash memory device.

10. The method of claim 1, wherein said die fabricating step and said memory device fabricating step are performed contemporaneously.

11. A method of fabricating a semiconductor wafer, comprising the steps of:

fabricating a number of die on said wafer;

fabricating a memory device on said wafer;

testing said number of die with a die testing apparatus so as to obtain test data associated with said number of die;

storing said test data obtained during said testing step in said memory device;

retrieving said test data from said memory device; and operating a packaging apparatus so as to package a first die of said number of die based on said test data.

12. The method of claim 11, further comprising the step:

operating said packaging apparatus so as to disregard a second die of said number of die based on said test data.

13. The method of claim 12, wherein:

said testing step includes the steps of (i) performing a functional test on said first die of said number of die with said die testing apparatus, and (ii) generating a die-pass control signal if said first die of said number of die passes said functional test, said storing step includes the step of storing a pass record in a data location associated with said first die of said number of die in said memory device in response to generation of said die-pass control signal, said retrieving step includes the step of retrieving said pass record from said data location associated with said first die of said number of die in said memory device, and said operating step includes the step of operating said packaging apparatus so as to package said first die of said number of die based on said pass record.

14. The method of claim 12, wherein:

said testing step includes the steps of (i) performing a functional test on said second die of said number of die with said die testing apparatus, and (ii) generating a die-fail control signal if said second die of said number of die fails said functional test, said storing step includes the step of storing a fail record in a data location associated with said second die of said number of die in said memory device in response to generation of said die-fail control signal, said retrieving step includes the step of retrieving said fail record from said data location associated with said second die of said number of die in said memory device, and said operating step includes the step of operating said packaging apparatus so as to package said second die of said number of die based on said fail record.

15. The method of claim 11, wherein:

said memory device includes a non-volatile memory device, and said storing step includes the step of storing said test data obtained during said testing step in said non-volatile memory device, and said memory device fabricating step includes the step of fabricating said non-volatile memory device on said wafer.

16. The method of claim 15, wherein said non-volatile memory device includes a flash memory device.

17. The method of claim 11, wherein said die fabricating step and said memory device fabricating step are performed contemporaneously.

* * * * *